United States Patent
Kim et al.

(10) Patent No.: US 9,117,999 B2
(45) Date of Patent: Aug. 25, 2015

(54) PIEZOELECTRIC VIBRATION MODULE

(75) Inventors: Jae Kyung Kim, Gyunggi-do (KR);
Dong Sun Park, Gyunggi-do (KR);
Yeon Ho Son, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 298 days.

(21) Appl. No.: 13/536,332

(22) Filed: Jun. 28, 2012

(65) Prior Publication Data

US 2013/0002093 A1    Jan. 3, 2013

(30) Foreign Application Priority Data

Jun. 30, 2011    (KR) .................. 10-2011-0064704

(51) Int. Cl.
| | | |
|---|---|---|
| H01L 41/053 | (2006.01) | |
| H01L 41/09 | (2006.01) | |
| H03H 9/17 | (2006.01) | |
| G06F 3/01 | (2006.01) | |

(52) U.S. Cl.
CPC ............ *H01L 41/0986* (2013.01); *G06F 3/016* (2013.01); *H01L 41/098* (2013.01); *H03H 9/17* (2013.01)

(58) Field of Classification Search
CPC .... G01K 11/002; G01K 9/122; B06B 1/0685; G10K 11/165; H04R 17/00; H01L 1/0926
USPC ................ 310/323.01, 324, 327, 329, 330
See application file for complete search history.

(56) References Cited

U.S. PATENT DOCUMENTS

| | | | | |
|---|---|---|---|---|
| 7,555,133 | B2* | 6/2009 | Hama ......................... | 381/190 |
| 8,406,438 | B2* | 3/2013 | Ihl et al. ....................... | 381/190 |
| 2005/0231076 | A1* | 10/2005 | Takeuchi et al. ............. | 310/328 |
| 2008/0056515 | A1* | 3/2008 | Hama ......................... | 381/191 |
| 2008/0136292 | A1* | 6/2008 | Thiesen ....................... | 310/334 |
| 2010/0079039 | A1* | 4/2010 | Lampenscherf et al. ..... | 310/367 |

FOREIGN PATENT DOCUMENTS

KR    10-2011-0045486        5/2011

OTHER PUBLICATIONS

Office Action dated Jan. 13, 2015 for Korean Patent Application No. 10-2011-0064704 and its English summary provided by Applicant's foreign counsel.

* cited by examiner

*Primary Examiner* — Derek Rosenau
*Assistant Examiner* — Bryan Gordon
(74) *Attorney, Agent, or Firm* — Ladas & Parry, LLP (57) ABSTRACT

Disclosed herein is a piezoelectric vibration module including: a piezoelectric element repeatedly extended and compressed according to application of external power to generate vibration force; a vibration plate having the piezoelectric element coupled to one surface thereof and repeatedly extended and compressed integrally with the piezoelectric element to transfer the vibration force of the piezoelectric element to an external component; a weight body having a central portion coupled to the other side of the vibration plate in order to increase the vibration force of the piezoelectric element; and a coupling member fixedly coupling the central portion of the weight body and the vibration plate to each other.

18 Claims, 9 Drawing Sheets

FIG. 1

Prior Art

PIEZOELECTRIC VIBRATION MODULE

CROSS REFERENCE TO RELATED APPLICATION

This application claims the benefit of Korean Patent Application No. 10-2011-0064704, filed on Jun. 30, 2011, entitled "Piezo Vibration Module", which is hereby incorporated by reference in its entirety into this application.

BACKGROUND OF THE INVENTION

1. Technical Field

The present invention relates to a piezoelectric vibration module.

2. Description of the Related Art

Generally, in a portable electronic device such as a portable phone, an e-book, a game machine, a portable multimedia player (PMP), or the like, a vibration function has been utilized for various uses.

Particularly, a vibration generating apparatus for generating the vibration has been mainly mounted in the portable electronic device such as the portable phone, or the like, to thereby be used as an alert function that is a soundless receiving signal.

Further, in accordance with the multi-functionalization of the portable electronic device, multi-functionalization as well as miniaturization and integration of the vibration generating apparatus have been demanded.

Further, in accordance with the recent demand by users for simple use of the portable electronic device, a touch type device performing input by touching the electronic device has been generally used.

A concept of a currently generally used haptic feedback device includes a concept of reflecting intuitive experience of an interface user and diversifying feedback for a touch, in addition to a concept of performing input through a touch.

Therefore, a vibration motor using a piezoelectric element has been mainly used as the vibration generating apparatus generating vibration in the touch type device.

The reason is that the vibration motor using a piezoelectric element may have more rapid response time than that of an existing vibration motor using an eccentricity and be driven at various frequencies.

However, a general vibration generating apparatus that is currently being used transfers the vibration by mounting a vibration motor or a linear actuator in a portable electronic device set (or body).

Figure 1:
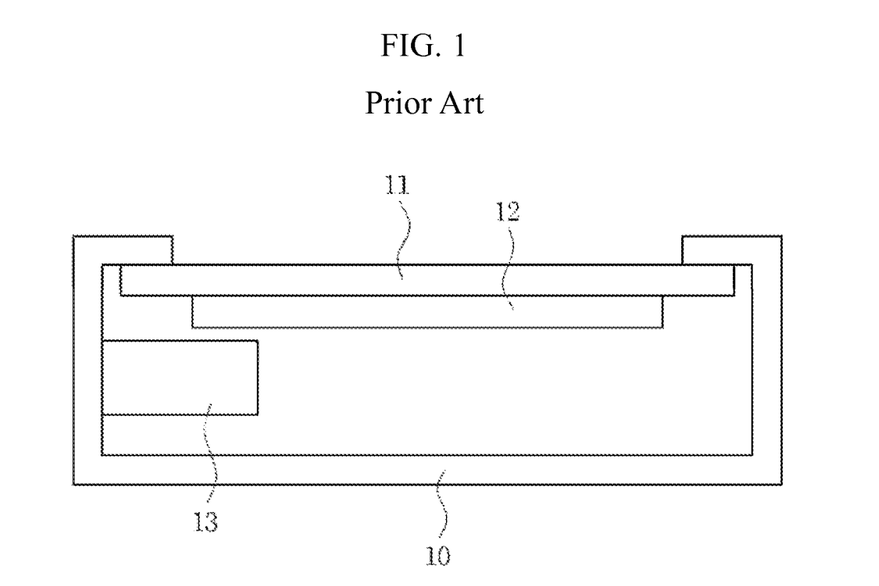
FIG. 1 is a cross-sectional view showing a coupling relationship between a vibration generating apparatus and a body according to the prior art.

As shown in FIG. 1, since a vibration generating apparatus 13 is mounted is in a portable electronic device set (or a body) 10, when a user presses a touch screen panel (TSP) 11 with a finger to operate the portable electronic device, vibration force is appropriately transferred to a hand gripping the portable electronic device, but is not be sufficiently transferred to the TSP 11 that is a position at which input is performed using the finger, such that the user feels a small amount of vibration.

In addition, in order to maximize the vibration force in the TSP 11, the vibration generating apparatus should be directly attached to a lower surface of a liquid crystal display (LCD) 12. However, in this case, it is difficult to thinly design an existing vibration generating apparatus 13, such that the vibration generating apparatus 13 has been attached to and driven on a rear surface of the LCD 12.

SUMMARY OF THE INVENTION

The present invention has been made in an effort to provide a piezoelectric vibration module capable of being thinned and generating vibration by being attached to a lower surface of a liquid crystal display (LCD) in order to directly transfer vibration force to a touch screen panel.

According to a preferred embodiment of the present invention, there is provided a piezoelectric vibration module including: a piezoelectric element repeatedly extended and compressed according to application of external power to generate vibration force; a vibration plate having the piezoelectric element coupled to one surface thereof and repeatedly extended and compressed integrally with the piezoelectric element to transfer the vibration force of the piezoelectric element to an external component; a weight body having a central portion coupled to the other side of the vibration plate in order to increase the vibration force of the piezoelectric element; and a coupling member fixedly coupling the central portion of the weight body and the vibration plate to each other.

The coupling member may fixedly couple a pair of opposite sides of the vibration plate facing the central portion of the weight body and a pair of opposite sides of the central portion of the weight body to each other.

The coupling member may include: first coupling parts fixedly coupling a pair of opposite sides of the vibration plate facing the central portion of the weight body and a pair of opposite sides of the central portion of the weight body to each other; and second coupling parts extended from the first coupling parts toward both ends of the weight body to thereby be fixedly coupled to the weight body while enclosing a pair of opposite sides of the weight body.

The coupling member may further include: detachment prevention parts bent from upper ends of the second coupling parts toward the weight body to press the weight body toward the vibration plate, and a plurality of adhesive grooves may be formed in inner peripheral surfaces of the second coupling parts so that an adhesive member for fixedly coupling the second coupling parts and the weight body to each other is applied to the inner peripheral surfaces of the second coupling parts.

The coupling member may include: first coupling parts fixedly coupling a pair of opposite sides of the vibration plate facing the central portion of the weight body and a pair of opposite sides of the central portion of the weight body to each other; second coupling parts extended from the first coupling parts toward both ends of the weight body to thereby be fixedly coupled to the weight body while enclosing a pair of opposite sides of the weight body; and third coupling parts extended from the second coupling parts and bent toward another pair of opposite sides of the weight body to thereby be fixedly coupled to the weight body while enclosing another pair of opposite sides of the weight body.

The coupling member may further include detachment prevention parts bent from upper ends of the second coupling parts toward the weight body to press the weight body toward the vibration plate, and a plurality of adhesive grooves may be formed in inner peripheral surfaces of the second or third coupling parts so that an adhesive member for fixedly coupling the second or third coupling parts and the weight body to each other is applied to the inner peripheral surfaces of the second or third coupling parts.

The piezoelectric element may be stacked in a monolayer form or in a multilayer form.

The weight body may be inclined upwardly from the central portion thereof fixedly coupled to the vibration plate toward both ends thereof.

Contact prevention members may be coupled to both ends of the weight body to prevent a contact between the weight body and the other surface of the vibration plate that is not fixedly coupled to the weight body.

The piezoelectric vibration module may further include a support member having one end coupled to both ends of the vibration plate and the other end coupled to the external component to transfer vibration force to the outside.

According to another preferred embodiment of the present invention, there is provided a piezoelectric vibration module including: a piezoelectric element repeatedly extended and compressed according to application of external power to generate vibration force; a vibration plate having the piezoelectric element coupled to one surface thereof and repeatedly extended and compressed integrally with the piezoelectric element to transfer the vibration force of the piezoelectric element to an external component; a weight body having a central portion coupled to the other side of the vibration plate in order to increase the vibration force of the piezoelectric element; a coupling member fixedly coupling the central portion of the weight body and the vibration plate to each other; an upper case having coupling parts coupled to both ends of the vibration plate and a receiving part formed therein so as to be spaced apart from the weight body; and a lower case coupled to a lower portion of the upper case so as to be spaced apart from the piezoelectric element and having protrusion parts fixedly coupled to the coupling parts of the upper case.

The weight body may be inclined upwardly from the central portion thereof fixedly coupled to the vibration plate toward both ends thereof.

The coupling member may include: first coupling parts fixedly coupling a pair of opposite sides of the vibration plate facing the central portion of the weight body and a pair of opposite sides of the central portion of the weight body to each other; second coupling parts extended from the first coupling parts toward both ends of the weight body to thereby be fixedly coupled to the weight body while enclosing a pair of opposite sides of the weight body; and third coupling parts extended from the second coupling parts and bent toward both another pair of opposite sides of the weight body to thereby be coupled to the weight body while enclosing another pair of opposite sides of the weight body.

The coupling member may further include detachment prevention parts bent from upper ends of the second coupling parts toward the weight body to press the weight body toward the vibration plate, and a plurality of adhesive grooves may be formed in inner peripheral surfaces of the second or third coupling part so that an adhesive member for fixedly coupling the second or third coupling parts and the weight body to each other is applied to the inner peripheral surfaces of the second or third coupling parts.

The piezoelectric vibration module may further include: a first anti-vibration member selectively coupled to an inner peripheral surface of the upper case or an upper portion of the weight body in order to prevent a contact and friction between the upper case and the weight body; second anti-vibration members coupled to both ends of the weight body in order to prevent a contact between the weight body and the other surface of the vibration plate that is not fixedly coupled to the weight body.

The lower case may be formed with an open region in order to prevent a contact between the piezoelectric element and the lower case at the time of driving of the piezoelectric element toward the lower case due to the compression of the piezoelectric element.

The piezoelectric vibration module may further include a third anti-vibration member attached to a lower surface of the piezoelectric element to prevent a contact between the piezoelectric element and the external component through the open region, wherein the lower surface of the lower case is coupled to the external component.

A third anti-vibration member may be coupled to an upper portion of the lower case in order to prevent a contact between the piezoelectric element and the lower case at the time of driving of the piezoelectric element toward the lower case due to compression of the piezoelectric element.

The piezoelectric vibration module may further include a flexible printed circuit (FPC) for applying the external power to the piezoelectric element.

The piezoelectric vibration module may further include an attaching member selectively attached to an outer peripheral surface of the upper case or the lower case.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
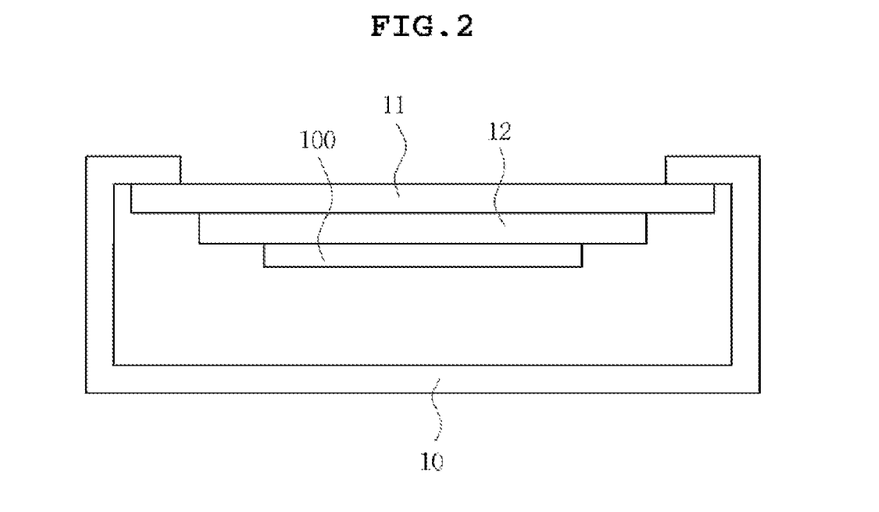
FIG. 2 is a cross-sectional view showing a coupling relationship between a piezoelectric vibration module and a body according to a preferred embodiment of the present invention.
Figure 3:
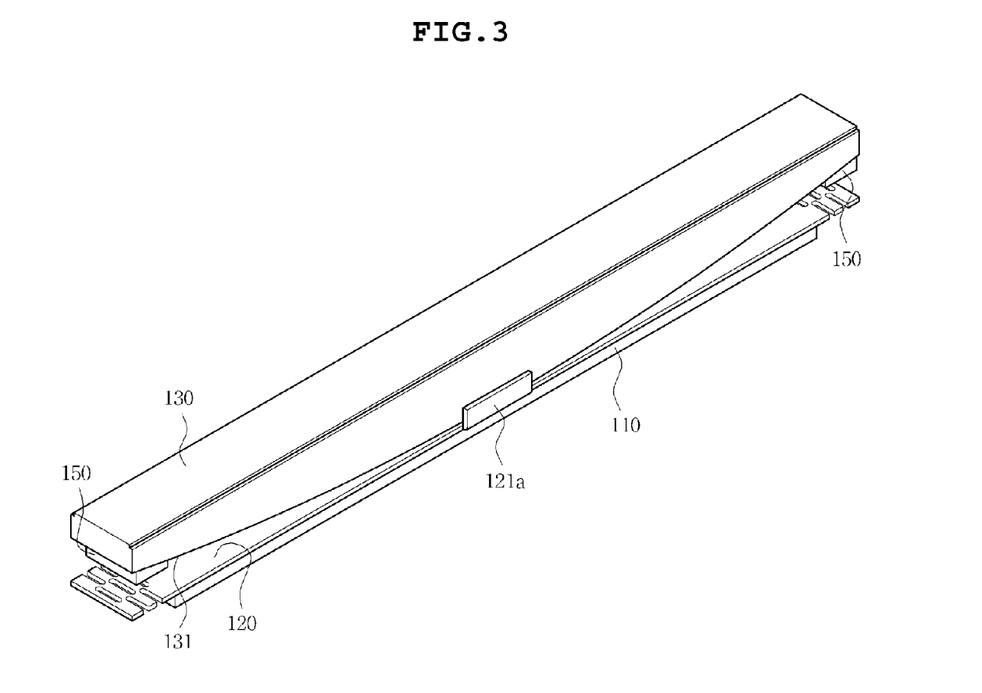
FIG. 3 is an assembled perspective view of a piezoelectric vibration module including a vibration plate according to a first preferred embodiment of the present invention.

FIG. 2 is a cross-sectional view showing a coupling relationship between a piezoelectric vibration module and a body according to a preferred embodiment of the present invention; FIG. 3 is an assembled perspective view of a piezoelectric vibration module including a vibration plate according to a first preferred embodiment of the present invention; and FIGS. 4A to 4C are cross-sectional views showing a process of driving the piezoelectric vibration module shown in FIG. 3.

Figure 4A:
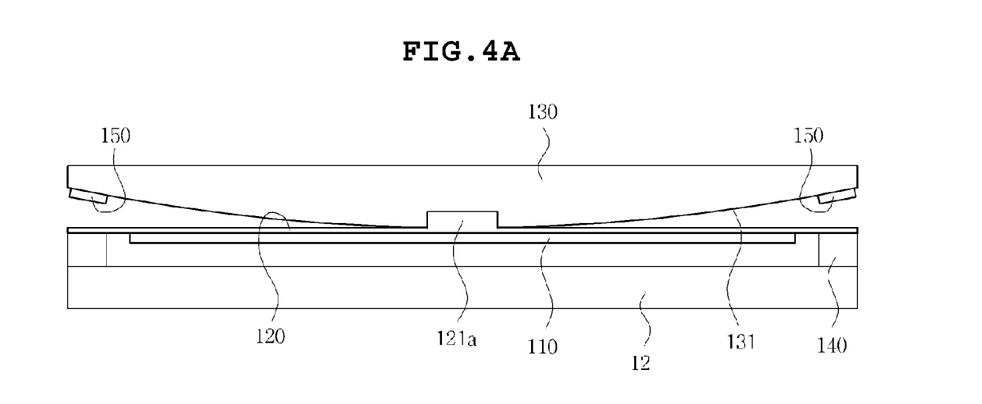
FIGS. 4A to 4C are cross-sectional views showing a process of driving the piezoelectric vibration module shown in FIG. 3.
Figure 4B:
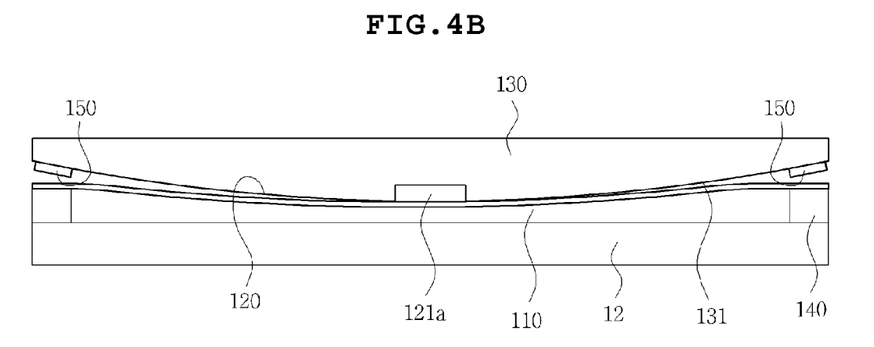
Figure 4C:
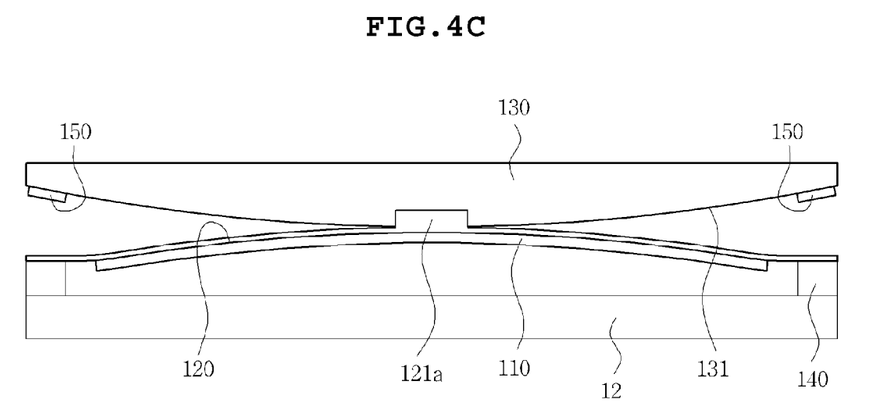

As shown in FIGS. 2 to 4, the piezoelectric vibration module 100 according to the preferred embodiment of the present invention may be coupled to one side of a liquid crystal display (LCD) 12 coupled to a lower portion of a touch screen panel (TSP) 11 in order to directly transfer vibration force to the TSP 11 and include a piezoelectric element 110, a vibration plate 120, a weight body 130, a coupling member 121a, a support member 140, and a contact prevention member 150.

More specifically, as shown in FIG. 3, when the piezoelectric element 110 is repeatedly extended and compressed according to application of external power, as shown in FIG. 4, the vibration plate 120 having the weight body 130 coupled to the other surface thereof is also repeatedly extended and compressed integrally with the piezoelectric element 110 to generate vibration force.

In addition, the piezoelectric element 110 may be stacked in a monolayer form or in a multilayer form. In the case in which the piezoelectric elements 110 are stacked in the multilayer form, an electric field required for driving the piezoelectric element 110 may be secured even at a low external voltage.

Therefore, since driving voltage of the piezoelectric vibration module may be reduced, it is preferable in the present invention that the piezoelectric elements 110 may be stacked in the multilayer form.

In addition, the piezoelectric element 110 is coupled to one surface of the vibration plate 120 in a bonding scheme or a soldering scheme.

The vibration plate 120 may be made of a metal material having elastic force, such as Sus in order to be deformed integrally with the piezoelectric element 110 repeatedly extended and compressed according to the application of the external power.

In addition, according to the preferred embodiment of the present invention, since the vibration plate 120 and the piezoelectric element 110 may also be coupled to each other in the bonding scheme, the vibration plate 120 may be made of Invar that is a material having a thermal expansion coefficient similar to that of the piezoelectric element 110 in order to prevent a bending phenomenon capable of being generated due to curing of an adhesive member.

Further, due to the vibration plate 120 made of the invar having a thermal expansion coefficient similar to that of the piezoelectric element 110, since a thermal stress generated in the piezoelectric element 110 at the time of operation at a high temperature external environment or thermal impact is reduced, a piezoelectric degradation phenomenon that electrical characteristics are degraded may be prevented.

In addition, the vibration plate 120 is coupled to the weight body 130 in the bonding scheme or the soldering scheme. To this end, the vibration plate 120 includes the coupling member 121a coupled to one side of the weight body 130.

As shown in FIG. 3, in the piezoelectric vibration motor 100 according to the preferred embodiment of the present invention, the weight body 130 is coupled to the other surface of the vibration plate 120 in order to increase the vibration force.

More specifically, in order to maximize the vibration force of the piezoelectric vibration motor 100 according to the preferred embodiment of the present invention, the weight body 130 may have a central portion coupled to a maximum displacement point at which the vibration plate 120 is maximally displaced according to the extension and compression of the piezoelectric element 110. According to the preferred embodiment of the present invention, the central portion of the weight body 130 and the maximum displacement point of the vibration plate 120 are fixedly coupled to each other using the coupling member 121a.

In addition, the weight body 130 may be made of a metal material, preferably, a tungsten material having relatively high density at the same volume.

Further, a surface of the weight body 130 may be liquid-coated in order to prevent the weight body 130 from being damaged due to a contact between the weight body 130 and the vibration plate 120 caused by driving of the vibration plate 120 in a vertical direction.

In addition, the weight body 130 may be provided with a round part 131 inclined upwardly from the central portion of the weight body 130 toward both ends of the weight body 130 in order to maximally increase the vibration force and prevent a contact with the other surface of the vibration plate 120 that is not fixedly coupled to the weight body 130.

As shown in FIGS. 4A to 4C, the piezoelectric vibration module 100 according to the preferred embodiment of the present invention is coupled to the LCD 12 that is an external component configuring a body.

More preferably, the piezoelectric vibration module 100 transfers the vibration force to the LCD 12 that is an external component, using the support members 140 having one end coupled to both ends of the vibration plate 120 and the other end coupled to the LCD 12.

FIG. 4A is a cross-sectional view showing a state before external power is applied; FIG. 4B is a cross-sectional view showing a state in which external power is applied to compress the piezoelectric element 110, such that the piezoelectric vibration module 100 is driven in a direction toward the LCD 12; and FIG. 4C is a cross-sectional view showing a state in which the piezoelectric element 110 is extended, such that the piezoelectric vibration module 100 is driven in an opposite direction of the LCD 12.

As shown in FIGS. 4A to 4C, since the weight body 130 has a horizontally symmetrical shape based on the central portion thereof and includes the round part 131, even though the vibration plate 120 is deformed in the direction toward the LCD 12 due to the compression of the piezoelectric element 110, the vibration plate 120 and the weight body 130 do not contact each other, such that the weight body 130 does not hinder driving of the piezoelectric vibration module 100 at all.

In addition, since the central portion of the weight body 130 and the maximum displacement point of the vibration plate facing the central portion of the weight body 130 are coupled to each other, larger vibration force may be generated as compared to a structure in which the entire surface of the weight body and the entire surface of the vibration plate are coupled to each other.

Further, in order to prevent friction and damage due to a contact between the weight body 130 and the vibration plate 120 caused by generation of excessive vibration force, a contact prevention member made of an anti-vibration material may be attached to the round part 131 of the weight body 130. According to the preferred embodiment of the present invention, both ends of the weight body 130 are provided with the contact prevention members 150.

Figure 5:
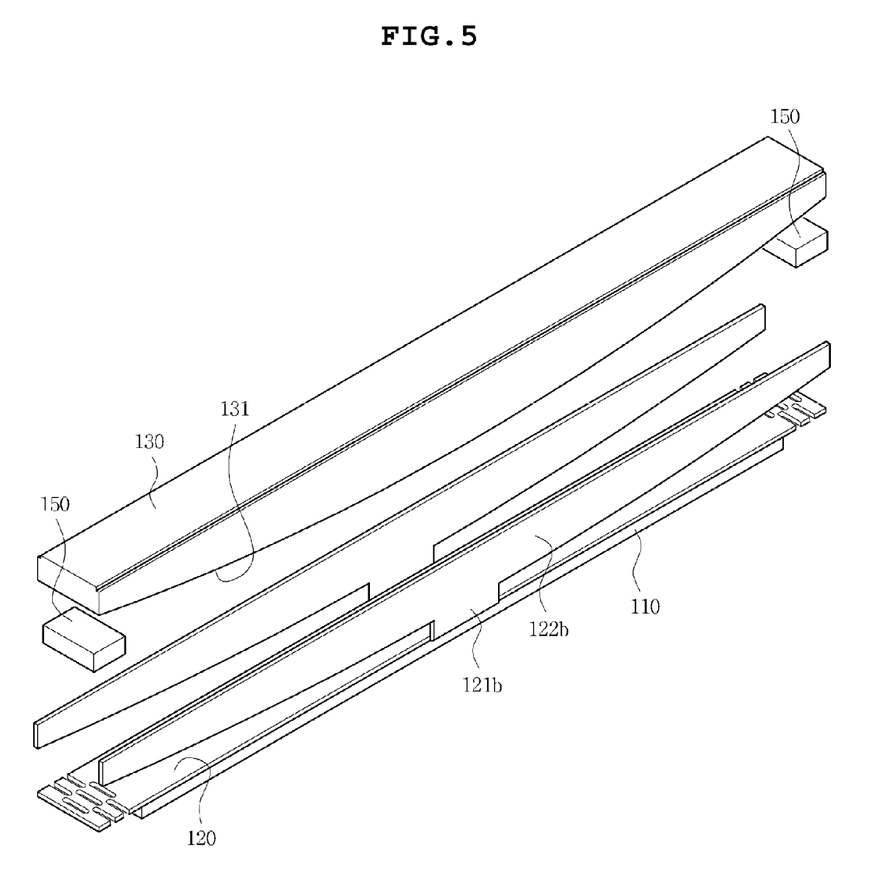
FIG. 5 is an exploded perspective view of a piezoelectric vibration module including a vibration plate according to a second preferred embodiment of the present invention.

FIG. 5 is an exploded perspective view of a piezoelectric vibration module including a vibration plate according to a second preferred embodiment of the present invention. As shown in FIG. 5, in order to prevent the weight body 130 from being detached due to the driving of the piezoelectric vibration module 100 in the vertical direction, the vibration plate 120 may include first coupling parts 121b and second coupling parts 122b.

More specifically, the first coupling parts 121b may fixedly couple a pair of opposite sides of the vibration plate 120 facing the central portion of the weight body 120 to a pair of opposite sides ëof the central portion of the weight body 130 in a bonding scheme or a soldering scheme.

In addition, the second coupling parts 122b are extended upwardly from the first coupling parts 121b and fixedly coupled to the weight body 130 while enclosing a pair of opposite sides corresponding to a length direction of the weight body 130 so as to be directed toward both ends of the weight body 130.

Figure 6:
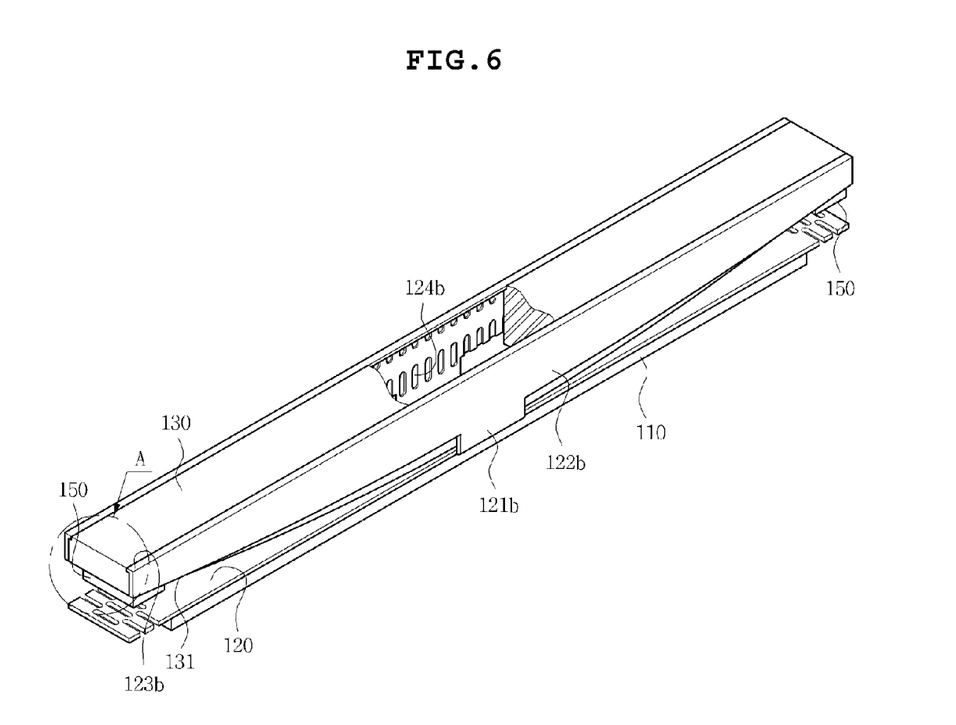
FIG. 6 is an assembled perspective view of a piezoelectric vibration module including a vibration plate according to a third preferred embodiment of the present invention.
Figure 7:
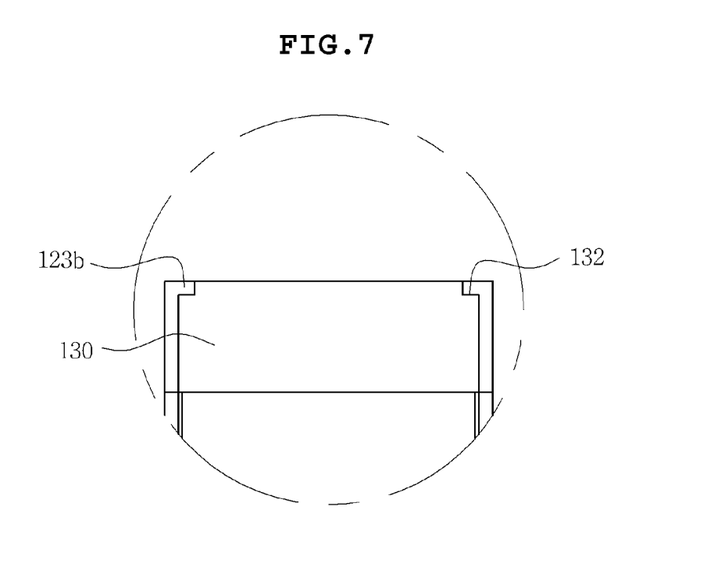
FIG. 7 is a partially enlarged view of the vibration plate shown in FIG. 6.

FIG. 6 is an assembled perspective view of a piezoelectric vibration module including a vibration plate according to a third preferred embodiment of the present invention; and FIG. 7 is a partially enlarged view of the vibration plate shown in FIG. 6. As shown in FIGS. 6 and 7, the vibration plate 120 may further include detachment prevention parts 123b and adhesion grooves 124b.

More specifically, as shown in FIG. 7 that is an enlarged view of the part A of FIG. 6, the detachment prevention parts 123b are bent from upper ends of the second coupling parts 122b toward the weight body 130 to press the weight body 130 toward the vibration plate 120.

In addition, step parts 132 corresponding to the detachment prevention parts 123b are formed at an upper portion of the weight body 130.

Therefore, the weight body 130 may be always coupled to the vibration plate 120 even though the vibration plate 120 is driven in the vertical direction or is in a stop state.

More specifically, as shown in FIG. 2, even though the piezoelectric vibration module 100 is coupled to the LCD 12 so that the weight body 130 is directed toward a downward direction in which gravity acts, the weight body 130 is pressed toward the vibration plate 120 by the detachment prevention part 123b of the vibration plate 120, thereby making it possible to prevent detachment of the weight body 130 from the vibration plate 120 due to impact applied from the outside in advance.

In addition, although excessive driving force acts, the weight body 130 may be always driven integrally with the vibration plate 120.

Further, as shown in FIG. 6, a plurality of adhesive grooves 124b may be formed in inner peripheral surfaces of the second coupling parts 122b so that an adhesive member for firmly coupling the second coupling parts 122b and the weight body 130 to each other is applied to the inner peripheral surfaces of the second coupling parts 122b.

Figure 8:
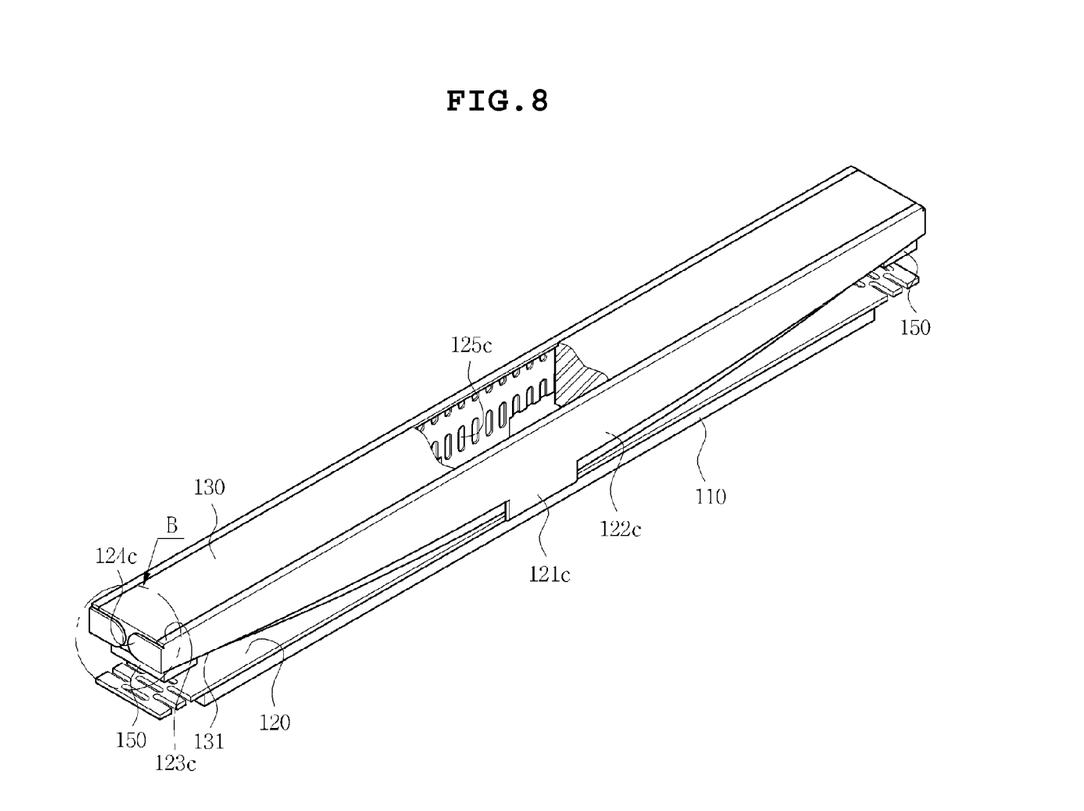
FIG. 8 is an assembled perspective view of a piezoelectric vibration module including a vibration plate according to a fourth preferred embodiment of the present invention.
Figure 9:
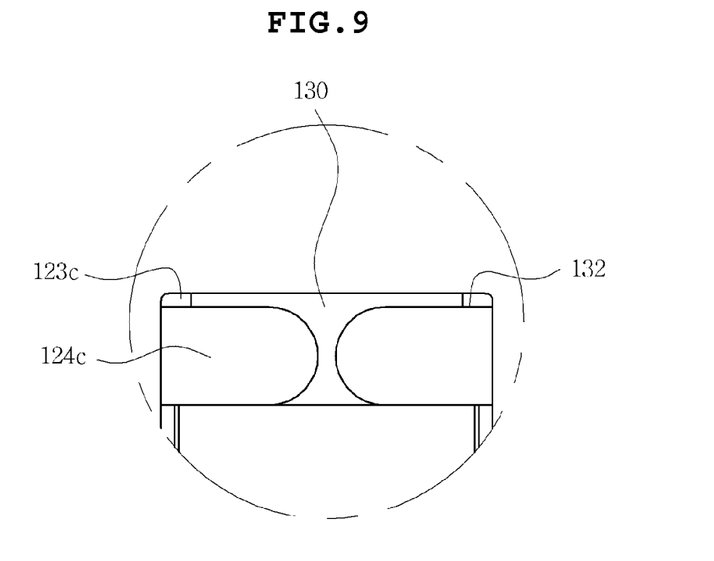
FIG. 9 is a partially enlarged view of the vibration plate shown in FIG. 8.

FIG. 8 is an assembled perspective view of a piezoelectric vibration module including a vibration plate according to a fourth preferred embodiment of the present invention; and FIG. 9 is a partially enlarged view of the vibration plate shown in FIG. 8. As shown in FIGS. 8 and 9, in order to prevent the weight body 130 from being detached due to the driving of the piezoelectric vibration module 100 in the vertical direction, the vibration plate 120 may include first coupling parts 121c, second coupling parts 122c, third coupling parts 123c, detachment prevention parts 124c, and adhesive grooves 125c.

More specifically, the first coupling parts 121c may fixedly couple a pair of opposite sides of the vibration plate 120 facing the central portion of the weight body 121 and a pair of opposite sides of the central portion of the weight body 130 to each other in a bonding scheme or a soldering scheme.

In addition, the second coupling parts 122c are extended upwardly from the first coupling parts 121c and fixedly coupled to the weight body 130 while enclosing a pair of opposite sides corresponding to a length direction of the weight body 130 so as to be directed toward both ends of the weight body 130.

Further, the third coupling parts 123c are extended from the second coupling parts 122c. More specifically, the third coupling parts 123c are fixedly coupled to the weight body 130 while being bent in a width direction of the weight body 130 to enclose another pair of opposite sides ëcorresponding to a width direction of the weight body 130.

More specifically, as shown in FIG. 9 that is an enlarged view of the part B of FIG. 8, the detachment prevention parts 124c are bent from upper ends of the second coupling parts 122c toward the weight body 130 to press the weight body 130 toward the vibration plate 120.

In addition, step parts 132 corresponding to the detachment prevention parts 123b are formed at an upper portion of the weight body 130.

Further, as shown in FIG. 8, a plurality of adhesive grooves 125c may be formed in inner peripheral surfaces of the second or third coupling parts 122c or 123c so that an adhesive member for firmly coupling the second or third coupling parts 122c or 123c and the weight body 130 to each other is applied to the inner peripheral surfaces of the second or third coupling parts 122c or 123c.

Figure 10:
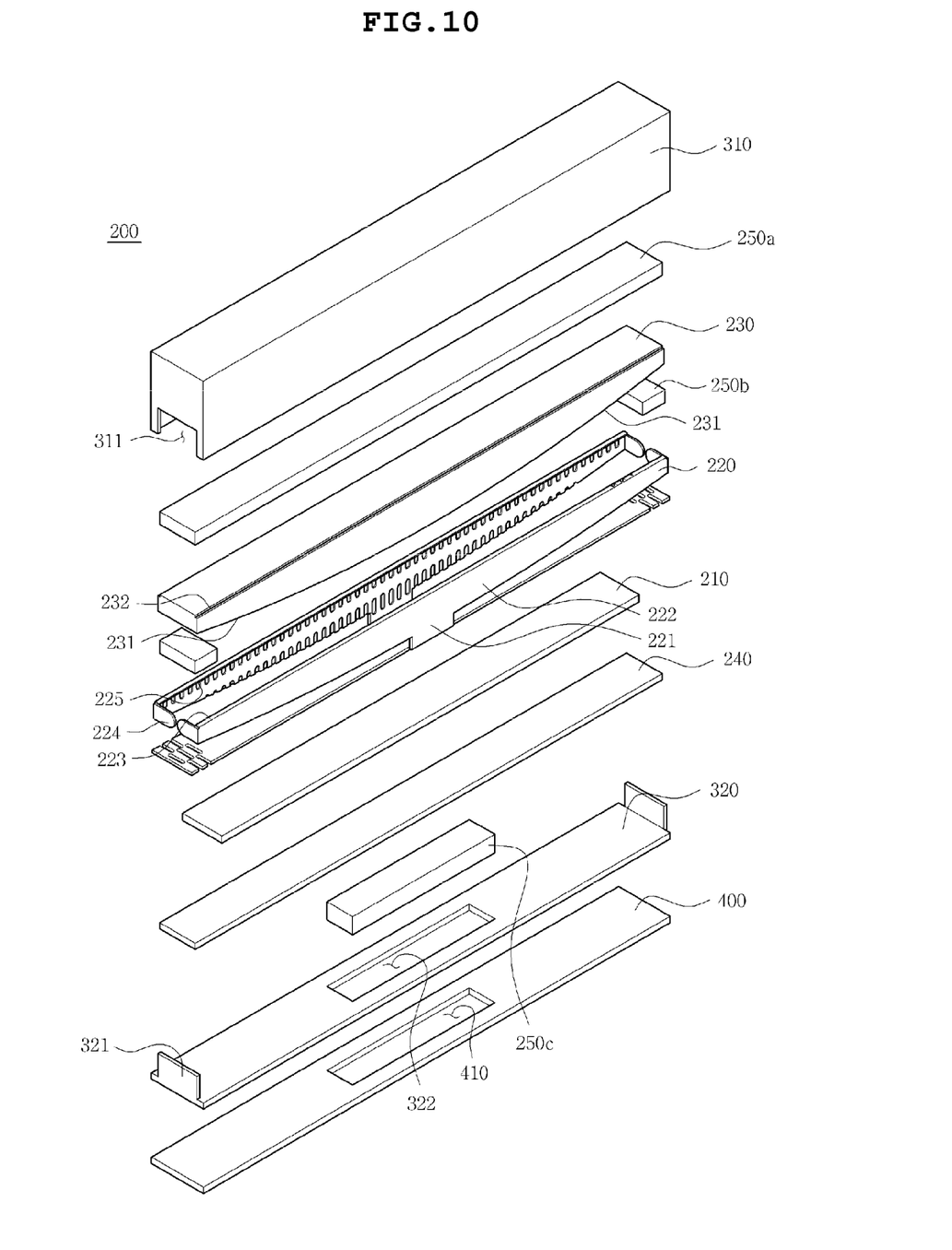
FIG. 10 is an exploded perspective view of a piezoelectric vibration module according to another preferred embodiment of the present invention.
Figure 11:
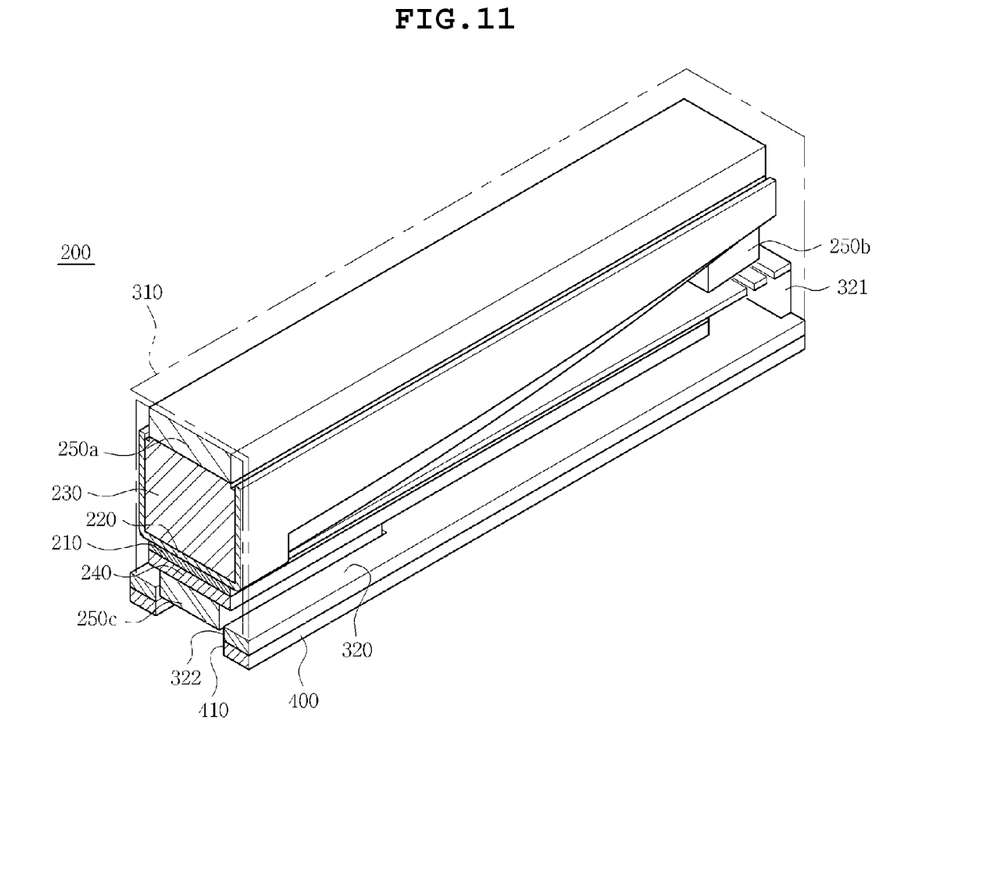
FIG. 11 is a perspective view showing an assembled cross-section of the piezoelectric vibration module shown in FIG. 10.

FIG. 10 is an exploded perspective view of a piezoelectric vibration module according to another preferred embodiment of the present invention; and FIG. 11 is a perspective view showing an assembled cross-section of the piezoelectric vibration module shown in FIG. 10. As shown in FIGS. 10 and 11, the piezoelectric vibration module 200 may include a piezoelectric element 210, a vibration plate 220, a weight body 230, a flexible printed circuit (FPC) 240, a plurality of anti-vibration members 250a, 250b, and 250c, an upper case 310, a lower case 320, and an attaching member 400.

Here, a description of components corresponding to those of the piezoelectric vibration module according to the preferred embodiment of the present invention described above will be omitted.

As shown in FIGS. 10 and 11, in order to make the piezoelectric vibration module 200 thin and improve adhesion between the piezoelectric vibration module 200 and surrounding components, the upper case 310 includes the piezoelectric element 210, the vibration plate 220, and the weight body 230 therein and has a receiving part formed therein so as to be spaced apart from an upper portion of the weight body 230.

In addition, both sides of the upper case 310 are provided with coupling parts 311 so as to be coupled to both ends of the vibration plate 220.

More specifically, both ends of the vibration plate 220 are coupled to the coupling parts 311, and protrusion parts 321 formed on a lower case 320 to be described below are fixedly coupled to the coupling parts 311, such that both distal ends of the vibration plate 220 are supported by the upper case 310 and the lower case 320, thereby making it possible to drive the vibration plate 220 in the upper case 310 and the lower case 320 in the vertical direction by extension and compression of the piezoelectric element 210, as shown in FIGS. 4A to 4C.

As described above, the lower case 320 is coupled to a lower surface of the upper case 310 to close an internal space of the upper case 310 and includes the protrusion parts 321 fixedly coupled to the coupling parts 311 formed at both sides of the upper case 310.

Further, in order to sufficiently secure driving displacement of the vibration plate 220 due to the compression of the piezoelectric element 210 and prevent a contact between the piezoelectric element 210 and the lower case 320 at the time of driving of the piezoelectric element 210 toward the lower case 320, an open region 322 is formed at a region facing a maximum displacement point of the vibration plate 220.

In addition, the attaching member 400 made of an adhesive material may be selectively provided on an upper surface of the upper case 310 or a lower surface of the lower case 320 in order to be coupled to a set. According to the preferred embodiment of the present invention, the attaching member 400 may be provided on the lower surface of the lower case 320.

Further, as shown in FIG. 11, the attaching member 400 may also have a shape corresponding to that of the lower case 320. Therefore, the adhesive member 400 may be formed with an open region 410 corresponding to the open region 322 of the lower case 320.

As shown in FIGS. 10 and 11, in the piezoelectric vibration module 200, in order to prevent a contact between the upper case 310 and the weight body 230, the first anti-vibration member 250a made of an elastic material may be selectively attached to an upper portion of the weight body 230 or an upper portion of an inner side of the upper case 310. According to the preferred embodiment of the present invention, the first anti-vibration member 250a may be attached to the upper portion of the weight body 230.

Further, in order to prevent friction and damage due to a contact between the weight body 230 and the vibration plate 220 caused by the generation of the excessive vibration force, the second anti-vibration member 250b made of an elastic material may be attached to the round part 231 of the weight body 230. According to the preferred embodiment of the present invention, both ends of the weight body 230 are provided with the second anti-vibration members 250b.

As shown in FIG. 11, the FPC 240 is coupled to a lower surface of the piezoelectric element 210 in order to apply external power to the piezoelectric element 210.

In addition, as described above, in order to prevent a contact between the piezoelectric element 310 and external components through the open region 322 caused by the generation of the excessive vibration force, the third anti-vibration member 250c made of an elastic material may be attached to the lower surface of the piezoelectric element 210.

Figure 12:
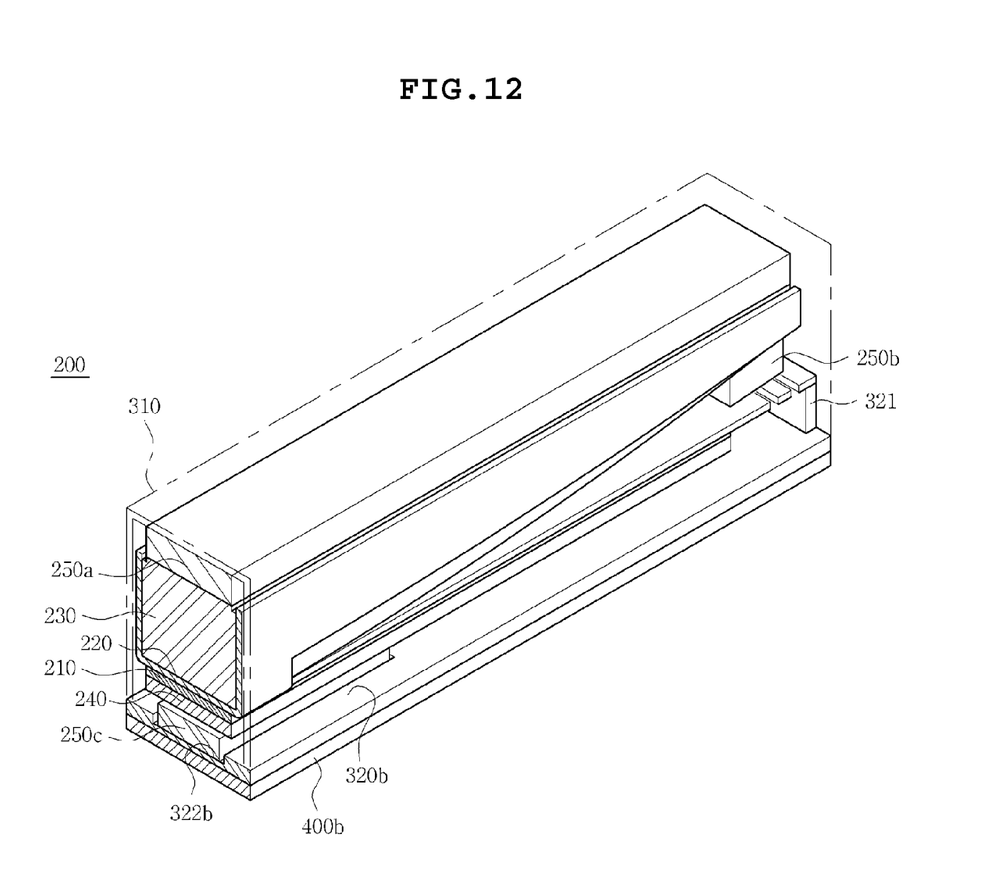
FIG. 12 is a perspective view showing an assembled cross-section of a piezoelectric vibration module according to still another preferred embodiment of the present invention.

FIG. 12 is a perspective view showing an assembled cross-section of a piezoelectric vibration module according to still another preferred embodiment of the present invention. As shown in FIG. 12, in order to prevent a contact between the piezoelectric element 310 and the lower case 320b caused by the generation of the excessive vibration force, the third anti-vibration member 250c made of an elastic material may be coupled to an upper portion of the lower case 320b. Therefore, the upper portion of the lower case 320b is formed with a coupling groove 322b for receiving the third anti-vibration member 250c therein.

As set forth above, according to the preferred embodiment of the present invention, the vibration force is directly transferred to the LCD configuring a set, thereby making it possible to provide rapid touch feeling to the user.

In addition, the case capable of receiving the piezoelectric element, the vibration plate, and the weight body therein is provided, such that the piezoelectric vibration module is easily attached at various positions of the set, thereby making it possible to improve a yield, simplify a working process, improve durability of a product, and make the piezoelectric vibration module thin.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A vibration module comprising:
   a vibrator configured to generate vibration force;
   a vibration plate having one surface coupled to the vibrator;
   a weight body having a central portion coupled to another surface of the vibration plate to increase the vibration force;
   a coupling member fixedly coupling the central portion of the weight body and the vibration plate to each other; and
   contact prevention members coupled to both ends of the weight body to prevent a contact between the weight body and the another surface of the vibration plate that is not fixedly coupled to the weight body,
   wherein the coupling member fixedly couples a pair of opposite sides of the vibration plate facing the central portion of the weight body and a pair of opposite sides of the central portion of the weight body to each other.

2. The vibration module as set forth in claim 1, wherein the coupling member further includes:
   detachment prevention parts bent from upper ends of the second coupling parts toward the weight body to press the weight body toward the vibration plate, wherein adhesive grooves are formed in inner surfaces of the second coupling parts so that an adhesive member for fixedly coupling the second coupling parts and the weight body to each other can be applied to the inner surfaces of the second coupling parts.

3. The vibration module as set forth in claim 1, wherein the coupling member further comprises:
   third coupling parts extended from the second coupling parts and bent toward another pair of opposite sides of the weight body, and fixedly coupled to the weight body while enclosing the another opposite sides of the weight body.

4. A vibrator configured to generate vibration forces;
   a vibration plate having one surface coupled to the vibrator;
   a weight body having a central portion coupled to the other side of the vibration plate in order to increase the vibration force; and a coupling member fixedly coupling the central portion of the weight body and the vibration plate to each other, wherein the coupling member includes:
third coupling parts extended from the second coupling parts and bent toward another pair of opposite sides of the weight body, and fixedly coupled to the weight body while enclosing the another opposite side of the weight body; and
detachment prevention parts bent from upper ends of the second coupling parts toward the weigh body to press the weight body toward the vibration plate, wherein adhesive grooves are formed in inner surfaces of the second or third coupling parts so that an adhesive member for fixedly coupling the second or third coupling parts and the weight body to each other can be applied to the inner surfaces of the second or third coupling parts, and wherein the coupling member fixedly couples a pair of opposite sides of the vibration plate facing the central portion of the weight body and a pair of opposite sides of the central portion of the weight body to each other and second coupling parts extend from the first coupling parts toward both ends of the weight body and fixedly coupled to the weight body, the second coupling parts enclosing a pair of opposite sides of the weight body.

5. The vibration module as set forth in claim 1, wherein the vibrator is stacked in a monolayer form or in a multilayer form.

6. The vibration module as set forth in claim 1, wherein the weight body is inclined upwardly from the central portion toward both ends thereof.

7. The vibration module as set forth in claim 1, further comprising a support member having one end coupled to the vibration plate and another end coupled to an external component to transfer vibration force to the outside of the vibration module.

8. A vibrator configured to generate vibration force;
a vibration plate having one surface coupled to the vibrator;
a weight body having a central portion coupled to the other side of the vibration plate in order to increase the vibration force;
a coupling member fixedly coupling the central portion of the weight body and the vibration plate to each other;
an upper case having coupling parts coupled to both ends of the vibration plate and a receiving part formed therein so as to be spaced apart from the weight body; and
a lower case coupled to a lower portion of the upper case so as to be spaced apart from the vibrator and having protrusion parts fixedly coupled to the coupling parts of the upper case, wherein the coupling member fixedly couples a pair of opposite sides of the vibration plate facing the central portion of the weight body and a pair of opposite sides of the central portion of the weight body to each other.

9. The vibration module as set forth in claim 8, further comprising:
a first member coupled to an inner surface of the upper case or an upper portion of the weight body to prevent contact and friction between the upper case and the weight body; and
second members coupled to both ends of the weight body to prevent contact between the weight body and the other surface of the vibration plate that is not fixedly coupled to the weight body.

10. The vibration module as set forth in claim 8, wherein the lower case is formed with an open region to prevent contact between the vibrator and the lower case at the time of vibration of the vibrator toward the lower case due to the vibration force.

11. The vibration module as set forth in claim 10, further comprising a third member attached to a lower surface of the vibrator to prevent contact between the vibrator and an external component through the open region,
wherein the lower surface of the lower case is coupled to the external component.

12. The vibration module as set forth in claim 9, further comprising a third member coupled to an upper portion of the lower case to prevent contact between the vibrator and the lower case at the time of vibration of the vibrator toward the lower case due to the vibration force.

13. The vibration module of claim 1, wherein the vibrator is extended and compressed in response to application of power.

14. The vibration module as set forth in claim 8, further comprising an attaching member attached to an outer surface of the upper case or the lower case.

15. The vibration module of claim 1, wherein the vibrator is a piezoelectric vibrator.

16. The vibration module as set forth in claim 13, further comprising a flexible circuit for applying power to the vibrator.

17. The vibration module of claim 1, wherein the central portion of the weight body is coupled to a point of the vibration plate which the vibration plate is maximally vibrated in response to the vibration force.

18. The vibration module of claim 1, wherein the vibration plate is made of an elastic material or a metal.

* * * * *